Aug. 2, 1955 L. E. BARTON ET AL 2,714,566

METHOD OF TREATING A GERMANIUM JUNCTION RECTIFIER

Filed May 28, 1952

INVENTORS:

LOY E. BARTON &

RALPH L. SHERWOOD

BY Morris A. Rahkin

ATTORNEY

United States Patent Office 2,714,566

Patented Aug. 2, 1955

2,714,566

METHOD OF TREATING A GERMANIUM JUNCTION RECTIFIER

Loy E. Barton, Princeton, and Ralph L. Sherwood, New Brunswick, N. J., assignors to Radio Corporation of America, a corporation of Delaware Application May 28, 1952, Serial No. 290,484

4 Claims. (Cl. 148—1.5)

Figure 1:
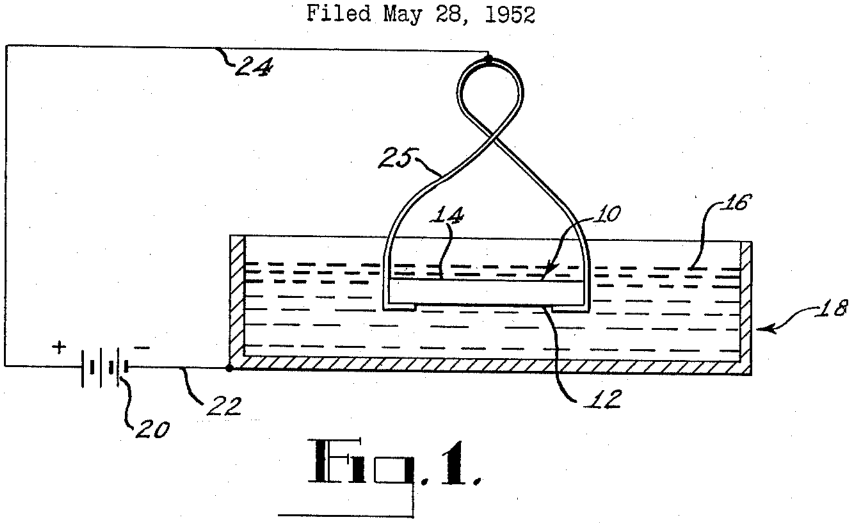

This invention relates to a method of making semiconductor devices, and more particularly, to a method of making semiconductor devices by means of electrolytically etching semiconductor materials and the diffusion of impurities therein. While not particularly limited thereto, the method of the present invention lends itself to the manufacture of germanium junction rectifiers possessing improved rectification characteristics.

The manufacture of semiconductor devices, as for example, germanium junction rectifiers by means of acid etching is well known in the art. A wafer of one type of germanium, for example, is ground to a desired thickness and one or more surfaces thereof are etched with a strong acid solution. The purpose of the etching process is to prepare these surfaces of the wafer of semiconductor material for the diffusion therein of an impurity that will produce a rectifying junction in the semiconductor. A single unit germanium junction rectifier made by the process of acid etching germanium and diffusing an impurity therein is generally incapable of rectifying alternating voltages of greater than 90 volts without breaking down. The breakdown of these single unit germanium rectifiers is caused by back current and overheating with the resultant breakdown of the P-N junction. Since the most commonly available source of alternating current is that of 120 volts at 60 cycles, it is highly desirable to have a single wafer germanium rectifier that would be capable of rectifying 120 volts A. C. without breaking down. Prior art germanium junction rectifiers capable of handling high alternating current voltages use multiple wafer rectifiers.

It is, therefore, a general object of the present invention to provide an improved method of making semiconductor devices which will possess improved rectification characteristics.

Another object of the present invention is to provide an improved method of making a single wafer germanium junction rectifier capable of rectifying 120 volt, 60 cycle alternating current easily and efficiently.

A further object of the present invention is to provide an improved method of making a semiconductor device employing electrolytic etching for cleaning the surface of the semiconductor material prior to the diffusion of an impurity therein.

According to the present invention, these and other objects and advantages are attained in an improved method of making semiconductor devices employing electrolytic etching. In accordance with one embodiment of the invention, a wafer is cut from a single crystal of N-type conductivity germanium, hereinafter called N-type germanium. The wafer of germanium is ground to a desired thickness, polished and electrolytically etched. The electrolytic etching is performed with a solution comprising distilled water having dissolved therein not more than 1/200 percent of electrolyte solute. The solute must be free from the elements in groups III and V of the chemical periodic table, since these elements impart P-type or N-type impurities, respectively to semiconducting germanium. Ordinary tap water free from N-type and P-type impurities has been found satisfactory for electrolytic etching. The electrolytic etching is carried out by submerging the surfaces of the semiconductor material to be cleaned into a metal container of tap water and a source of unidirectional potential connected between the wafer and the metal container. The positive terminal of the source of potential is connected to the wafer and the negative terminal is connected to the container so that a current flows through the germanium and etches the polished surfaces in contact with the solution. The electrolytic etching is carried out for at least five minutes. The wafer is then thoroughly washed in warm water and dried. A small piece of P-type impurity, indium, is then placed on the etched surface of the germanium and the surface is placed on a previously tinned copper base. This stack of materials is then heated in a hydrogen atmosphere at a temperature of about 500° C. for a period of about 20 minutes.

Figure 2:
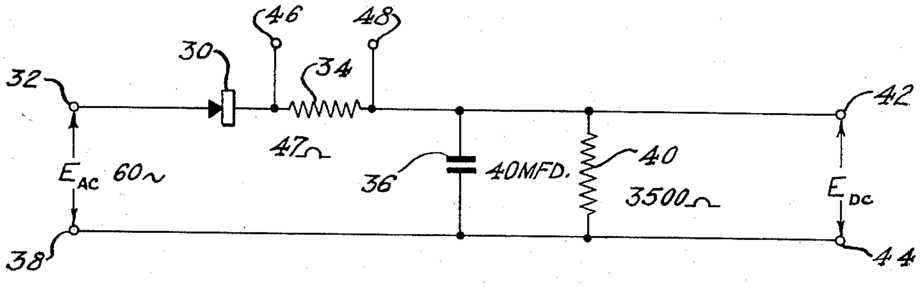

For a better understanding of the present invention, reference is had to the following description taken in connection with the accompanying drawing in which:

Fig. 1 is a schematic diagram, partly in cross-section, of apparatus used for electrolytically etching a wafer of semiconductor material, in accordance with the invention, and Fig. 2 is a schematic diagram of a circuit used to determine the characteristics of a germanium junction rectifier made in accordance with the process of the present invention.

The method of making semiconductor devices in accordance with the present invention will be described in connection with the manufacture of an improved germanium junction rectifier. A thin wafer is cut from a single crystal of N-type germanium. The surfaces of the wafer are ground and polished to a smooth finish. In order to prepare one surface for the diffusion therein of a P-type impurity, as for example, indium, this surface has to be cleaned thoroughly. Referring now to Fig. 1, there is shown the wafer of N-type germanium 10 having smooth, polished surfaces 12 and surface 14. The polished wafer 10 is submerged in a solution 16 in a metal container 18. A source of unidirectional voltage 20, of 20 to 50 volts, has its negative terminal electrically connected to the metal container 18 through a conductor 22, and its positive terminal electrically connected to the edges of the wafer 10 through a conductor 24 and spring clip 25. The electrical connection may also be made with solder, or any other suitable means. The solution 16 is electrically conductive. It may contain ordinary tap, drinking water which is free from impurities containing the dissolved elements in groups III and V of the chemical periodic table. Since the elements in groups III and V of the periodic table are considered as imparting to semiconducting germanium P-type and N-type conductivity characteristics respectively, it is desirable to prevent the wafer 10 from being contaminated with them. The solution 16 may also comprise three drops of nitric acid dissolved in 100 cc. of distilled water. The solution 16 comprises mainly distilled water and the amount of electrolyte solute therein is usually less than .005 percent. It will now be understood that the surfaces 12, 14 of the wafer 10 will be electrolytically etched when a current passes through the circuit of Fig. 1. Currents in the order of about 3 ma. have been found satisfactory. The electrolytic etching of the wafer 10 is conducted for at least five minutes during which time the surfaces 12, 14 of the wafer 10 are cleaned. Further electrolytic etching of the surfaces 12, 14 of the wafer 10 results in the surfaces being eaten away by the germanium oxide formed so that the wafer 10 is reduced in thickness. Wafers having a thickness between .005" and .007" have been found very satisfactory for junction rectifiers and transistors.

By the term electrolytic etching, as used herein, is meant the process of etching by means of an electric current as described herein, and as opposed to chemical or acid etching wherein a solution containing a relatively greater percentage of acid or corrosive solute is used.

After the surface 12 of the wafer 10 has been electrolytically etched for at least 5 minutes or longer, the wafer 10 is washed in running warm water and thoroughly dried. A small piece of indium, a P-type impurity, is then place on one dried etched surface of the wafer 10 and the whole placed on a previously tinned copper base and the assembly heated at about 500° C. for about 20 minutes in a hydrogen atmosphere. Upon cooling, the unit is complete except for terminal leads. The copper base which may dissipate heat, is the base terminal for the rectifier and the indium is the other rectifier terminal. It is noted that the wafer is soldered to the base at the time of firing.

A germanium junction rectifier, made in accordance with the method of the present invention, comprising a wafer of N-type germanium having a P-type impurity, indium, diffused into its electrolytically etched surface was tested by means of the half wave rectifier circuit shown in Fig. 2. A germanium junction rectifier 30 has one end connected to terminal 32 of a source of 60 cycle, 120 volt alternating current $E_{AC}$. The other end of the rectifier 30 is connected through a resistor 34 and a capacitor 36, in series therewith, to a second terminal 38 of the alternating voltage source $E_{AC}$. A load resistor 40 is connected across the capacitor 36 and across output terminals 42, 44. An additional load (not shown) may be connected across the terminals 42, 44. A pair of terminals 46, 48 are connected across the ends of the resistor 34, respectively, for the purpose of connecting an oscillograph thereacross to measure peak currents.

The germanium junction rectifier 30 comprising a single wafer of N-type germanium prepared in accordance with steps of electrolytically etching a surface thereof and diffusing indium therein, when tested in the test circuit of Fig. 2, having 120 volts, 60 cycle A. C. applied across the terminals 32, 38 have the following results:

D. C. output volts ($E_{DC}$)=150 volts
Peak A. C. volts=170 volts
Peak inverse voltage=320 volts
Peak D. C. current=450 ma.
Peak inverse current=0.35 ma.

Thus, it is seen that there has been provided an improved method of making semiconductor devices comprising the steps of electrically etching the surface of a semiconductor material, and the diffusing of an impurity through the electrically etched surface. Semiconductor devices made in accordance with the process of this invention exhibit improved rectification characteristics which make possible the use of a single wafer for the rectification of 120 volts A. C.

While only a specific embodiment of the invention has been shown and described in connection with the preparation of a germanium junction rectifier for the purpose of illustration, it is obvious that changes could be made without departing from the scope or spirit of the invention. It is also obvious that the present invention lends itself to the method of making transistors wherein opposite surfaces of a wafer of semiconductor material are electrolytically etched and an impurity is diffused into each surface. Therefore, the foregoing description is to be considered as illustrative and not in a limiting sense.

What is claimed is:

1. A method of treating a wafer of semi-conductive germanium of one conductivity type to introduce a layer of an opposite conductivity type therein comprising electrolytically etching the surface of said wafer in a solution of not more than $\frac{1}{200}$ percent electrolyte solute free from N-type and P-type impurities in distilled water, rinsing said surface, placing a selected impurity upon said surface, said selected impurity being a material which will impart conductivity characteristics of said opposite type to said body, and heating said wafer and impurity until said impurity diffuses into said wafer through the electrolytically etched surface thereof.

2. A method of treating a wafer of semiconductive germanium of one conductivity type to introduce a layer of an opposite conductivity type therein as defined in claim 1, wherein said electrolytic etching comprises applying to the surface of said wafer to be etched a solution comprising not more than $\frac{1}{200}$ percent electrolyte solute free from N-type and P-type impurities dissolved in distilled water, applying to the wafer a voltage which is positive with respect to the solution for at least five minutes, said voltage being between 20 and 50 volts, and causing a current to flow through said solution and said wafer.

3. A method of treating a wafer of semiconductive germanium of one conductivity type to form a P-N junction therein through the introduction of an impurity which is capable of imparting characteristics of an opposite conductivity type comprising placing a surface of said material in contact with a solution of distilled water containing not more than $\frac{1}{200}$ percent electrolyte solute dissolved therein, said solute being free from impurities capable of imparting P-type and N-type characteristics to germanium semiconducting material, causing a current to flow through said solution and wafer in a direction from the wafer to the solution for at least five minutes, washing said wafer in warm water, drying said wafer, and diffusing a pellet of said impurity through the etched surface of said material to form said P-N junction.

4. A method of treating a wafer of semiconductive germanium of one conductivity type to form a P-N junction therein through the introduction of an impurity capable of imparting opposite conductivity type characteristics as defined in claim 3, wherein said material comprises N-type germanium, said impurity comprises indium, and said diffusing step comprises placing a pellet of said indium on said etched surface of said wafer and heating said wafer and indium at about 500° C. for about 20 minutes.

References Cited in the file of this patent

UNITED STATES PATENTS

| | | |
|---|---|---|
| 2,437,474 | Orozco | Mar. 9, 1948 |
| 2,530,110 | Woodyard | Nov. 14, 1950 |
| 2,561,411 | Pfann | July 24, 1951 |
| 2,588,734 | Kolodney | Mar. 11, 1952 |
| 2,597,028 | Pfann | May 20, 1952 |
| 2,600,997 | Lark-Horovitz | June 17, 1952 |
| 2,602,763 | Scaff et al. | July 8, 1952 |
| 2,623,102 | Schockley | Dec. 23, 1952 |